US012775219B2

(12) United States Patent
Kim et al.

(10) Patent No.: US 12,775,219 B2
(45) Date of Patent: Oct. 27, 2026

(54) REAL-TIME PATTERNING HOTSPOT ANALYZER

(71) Applicant: Siemens Industry Software Inc., Plano, TX (US)

(72) Inventors: Young Chang Kim, San Jose, CA (US); Marko P. Chew, Palo Alto, CA (US); Lianghong Yin, Fremont, CA (US); Abhinandan Nath, Guwahati (IN); John L. Sturtevant, Portland, OR (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 18/558,455

(22) PCT Filed: Aug. 30, 2021

(86) PCT No.: PCT/US2021/048149
§ 371 (c)(1),
(2) Date: Nov. 1, 2023

(87) PCT Pub. No.: WO2022/245381
PCT Pub. Date: Nov. 24, 2022

(65) Prior Publication Data
US 2024/0219847 A1 Jul. 4, 2024

Related U.S. Application Data

(60) Provisional application No. 63/191,772, filed on May 21, 2021.

(51) Int. Cl.
*G03F 7/00* (2006.01)

(52) U.S. Cl.
CPC ........ *G03F 7/706839* (2023.05); *G03F 7/705* (2013.01); *G03F 7/70633* (2013.01); *G03F 7/7065* (2013.01)

(58) Field of Classification Search
CPC .... G03F 7/705; G03F 7/70633; G03F 7/7065; G03F 7/706839; G03F 7/70525
See application file for complete search history.

(56) References Cited

U.S. PATENT DOCUMENTS 7,689,948 B1 3/2010 White et al.
10,496,780 B1 * 12/2019 Lam .......................... G03F 1/36
(Continued)

OTHER PUBLICATIONS

Lianghong Yin, John Sturtevant, Alberto Lopez Gomez, Shumay Shang, Young Chang Kim, Kostas Adam, Marko Chew, Abhinandan Nath, Boris Habets, Manuela Gutsch, Philip Groeger, "Real-time full-wafer design-based inter-layer virtual metrology," Metrology, Inspection, and Process Control for Microlithography XXXIV Spie. Mar. 20, 2020.

(Continued)

*Primary Examiner* — Deoram Persaud

(57) ABSTRACT

This application discloses a hotspot identification system to generate process variability bands for structures of an integrated circuit capable of being fabricated utilizing at least one lithographic mask based, at least in part, on a mask layout data describing the lithographic mask and a distribution of manufacturing parameters during fabrication. The hotspot identification system can utilize the process variability bands to identify a subset of the structures that correspond to hotspots in the integrated circuit and identify corresponding values for the manufacturing parameters associated with the identified hotspots. A wafer testing system can implement a real-time wafer assessment process by comparing measured manufacturing parameters associated with a fabricated integrated circuit to the values for the manufacturing parameters associated with the identified hotspots, and dynamically identifying a disposition for the
(Continued)

fabricated integrated circuit corresponding to one or more structures associated with the identified hotspot based on the comparison.

14 Claims, 7 Drawing Sheets

(56) References Cited

U.S. PATENT DOCUMENTS

| | | | | |
|---|---|---|---|---|
| 10,621,302 | B2 * | 4/2020 | Sha | G03F 1/70 |
| 10,866,506 | B2 * | 12/2020 | Tien | G03F 1/36 |
| 12,242,201 | B2 * | 3/2025 | Zhang | G03F 7/7085 |
| 2008/0005704 | A1 | 1/2008 | Miloslavsky | |
| 2008/0148198 | A1 * | 6/2008 | Kyoh | G03F 1/36 716/55 |
| 2009/0144691 | A1 * | 6/2009 | Rathsack | H10P 74/23 716/56 |
| 2012/0040280 | A1 * | 2/2012 | Agarwal | G03F 7/70433 430/30 |
| 2012/0054694 | A1 * | 3/2012 | Hamouda | G03F 7/705 716/53 |
| 2014/0358830 | A1 * | 12/2014 | Chiang | G03F 7/70433 706/12 |
| 2015/0356233 | A1 | 12/2015 | Fouquet et al. | |
| 2016/0321793 | A1 * | 11/2016 | Chang | G06T 7/0004 |
| 2019/0147127 | A1 * | 5/2019 | Su | G03F 7/705 703/7 |
| 2019/0310553 | A1 | 10/2019 | Jochemsen et al. | |

OTHER PUBLICATIONS

Carsten Hartig, et al., "Combined process window monitoring for critical features", Proc. SPIE. 10145, Metrology, Inspection, and Process Control for Microlithography XXXI. Mar. 28, 2017.

John Sturtevant, Rachit Gupta, Shumay Shang, Vlad Liubich, James Word, "Characterization and mitigation of relative edge placement errors (rEPE) in full-chip computational lithography", Proc. SPIE 9635, Photomask Technology. Oct. 23, 2015.

John Sturtevant, Vlad Liubich, Rachit Gupta, "Two-layer critical dimensions and overlay process window characterization and improvement in full-chip computational lithography," Journal of Micro/Nanolithography, MEMS, MOEMS, vol. 5, Issue 2. Apr. 27, 2016.

* cited by examiner

REAL-TIME PATTERNING HOTSPOT ANALYZER

RELATED APPLICATION

This patent application claims priority to U.S. Provisional Patent Application No. 63/191,772, filed May 21, 2021, which is incorporated by reference herein.

TECHNICAL FIELD

This application is generally related to electronic design automation and, more specifically, to real-time patterning hotspot analyzer.

BACKGROUND

In a design flow for fabricating integrated circuits, a physical design of an integrated circuit can describe specific geometric elements, often referred to as a "layout" design. The geometric elements, which typically are polygons, define the shapes that will be created in various materials to manufacture the integrated circuit. Typically, a designer will select groups of geometric elements representing circuit device components, e.g., contacts, gates, etc., and place them in a design area. These groups of geometric elements may be custom designed, selected from a library of previously-created designs, or some combination of both. Once the groups of geometric elements representing circuit device components have been placed, geometric elements representing connection lines then are then placed between these geometric elements according to the predetermined route. These lines will form the wiring used to interconnect the electronic devices.

Circuit layout descriptions can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or poly-lines, circles and textboxes). Other formats include an open source format named Open Access, Milkyway, EDDM, and Open Artwork System Interchange Standard (OASIS). These various industry formats are used to define the geometrical information in layout designs that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a layout design define the relative locations or areas of the circuit that will be exposed to radiation through the mask. A mask or reticle writing tool is used to create the mask based upon the layout design, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the layout design onto the substrate. The diffractive effects of light often result in defects where the intended image is not accurately "printed" onto the substrate during the photolithographic process, creating flaws in the manufactured device. One or more resolution enhancement techniques (RETs) are often employed to improve the resolution of the image that the mask forms on the substrate during the photolithographic process.

One of these techniques, "optical proximity correction" or "optical process correction" (OPC), adjusts the amplitude of the light transmitted through a lithographic mask by modifying the mask layout design data employed to create the mask. For example, edges in the mask layout design may be adjusted to make certain portions of the geometric elements larger or smaller, in accordance with how much additional light exposure (or lack of exposure) is desired at certain points on the substrate. When these adjustments are appropriately calibrated, overall pattern fidelity can be improved.

During manufacturing, a semiconductor manufacturer can utilize lithographic masks created based on the mask layout design data to fabricate the integrated circuit. The manufacturing processes used by the semiconductor manufacturer, however, can have parameters that vary during fabrication of the integrated circuit, such as an exposure dose and focal plane of the light transmitted through the lithographic masks, which can alter a size and/or shape of some integrated circuit structures. In some instances, these alterations of size and/or shape can lead to a defect in the integrated circuit, for example, when the structure exceeds an error tolerance for a critical dimension in the integrated circuit. Another parameter than can vary corresponds to a relative alignment of fabricated structures on different layers of the integrated circuit, which can lead to structures overlapping to cause an inadvertent short or lead to structures not non-overlapping, severing an intended electronical connection.

Designers can utilize lithographic simulations to analyze how a set of dose, focus, and alignment values can affect patterns involved in integrated circuit manufacturing, and determine whether one or more manufacturing steps have to be reworked. These lithographic simulations and corresponding analysis, however, can be computationally expensive, time-consuming, and impractical when performed in real-time after integrated circuit manufacturing, so many designers tend to make overly-conservative rework decisions, which unnecessarily adds cost to the overall fabrication flow.

SUMMARY

This application discloses a bifurcated wafer analysis process, which includes offline hotspot detection and characterization performed by a hotspot identification system and a real-time wafer assessment performed by a wafer testing system. The hotspot identification system can generate process variability bands for structures of an integrated circuit capable of being fabricated utilizing at least one lithographic mask based, at least in part, on a mask layout data describing the lithographic mask and a distribution of manufacturing parameters during fabrication. The hotspot identification system can utilize the process variability bands to identify a subset of the structures that correspond to hotspots in the integrated circuit and identify corresponding values for the manufacturing parameters associated with the identified hotspots. The wafer testing system can implement the real-time wafer assessment process by comparing measured manufacturing parameters associated with a fabricated integrated circuit to the values for the manufacturing parameters associated with the identified hotspots, and dynamically identifying a disposition for the fabricated integrated circuit corresponding to one or more structures associated with the identified hotspot based on the comparison. Embodiments will be described below in greater detail.

DETAILED DESCRIPTION

Figure 1:
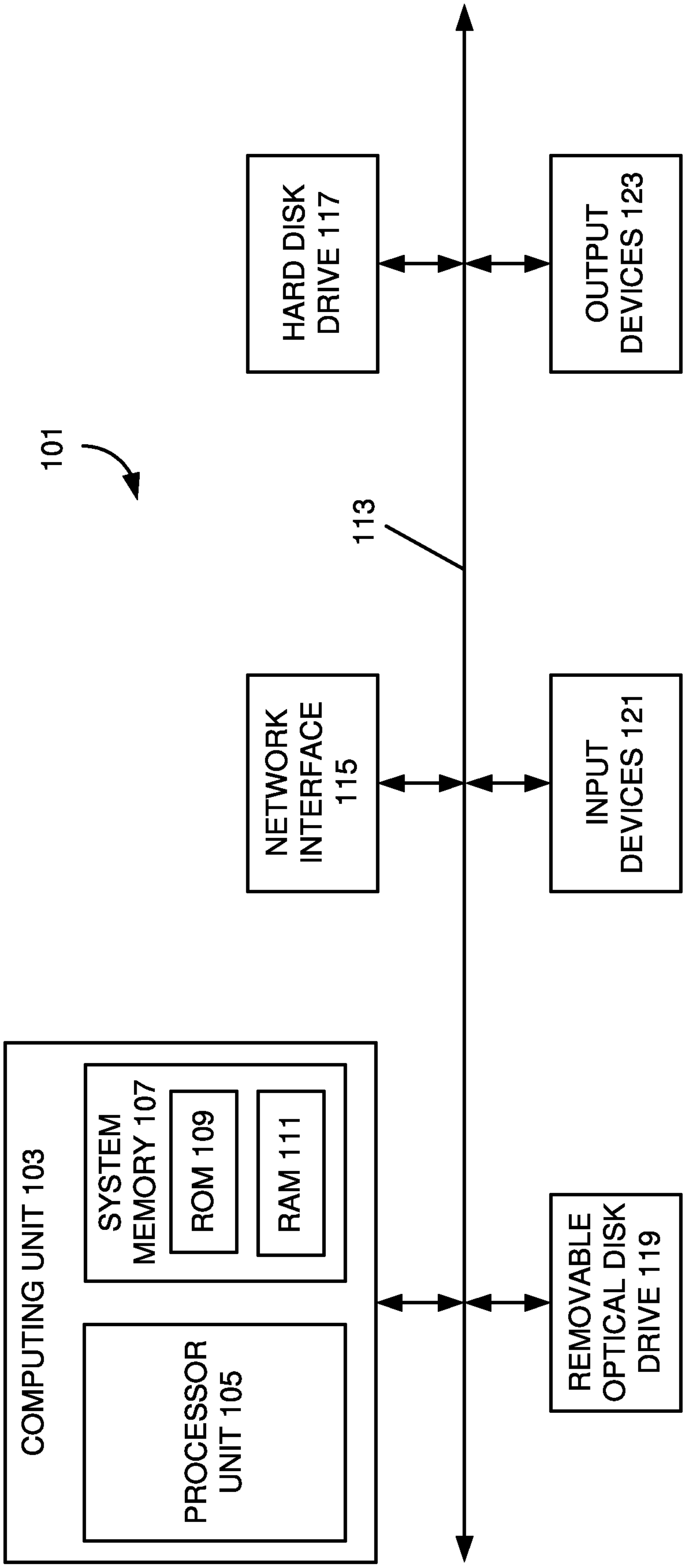
FIGS. 1 and 2 illustrate an example of a computer system of the type that may be used to implement various embodiments.

Various examples may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 115-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 115-123 may be internally housed with the computing unit 103. Alternately, one or more of the peripheral devices 115-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
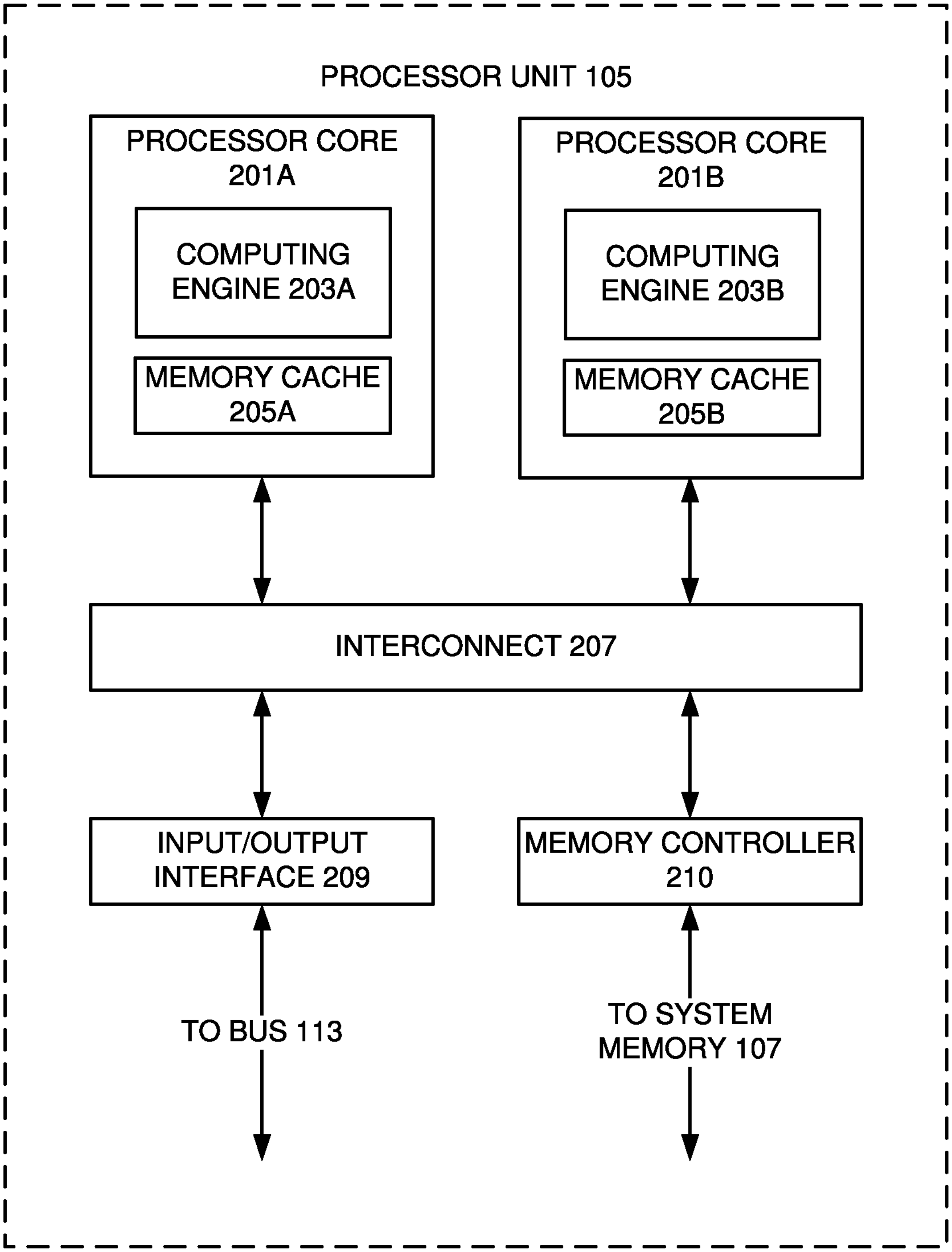

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, California, the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Real-Time Patterning Hotspot Analyzer

Figure 3:
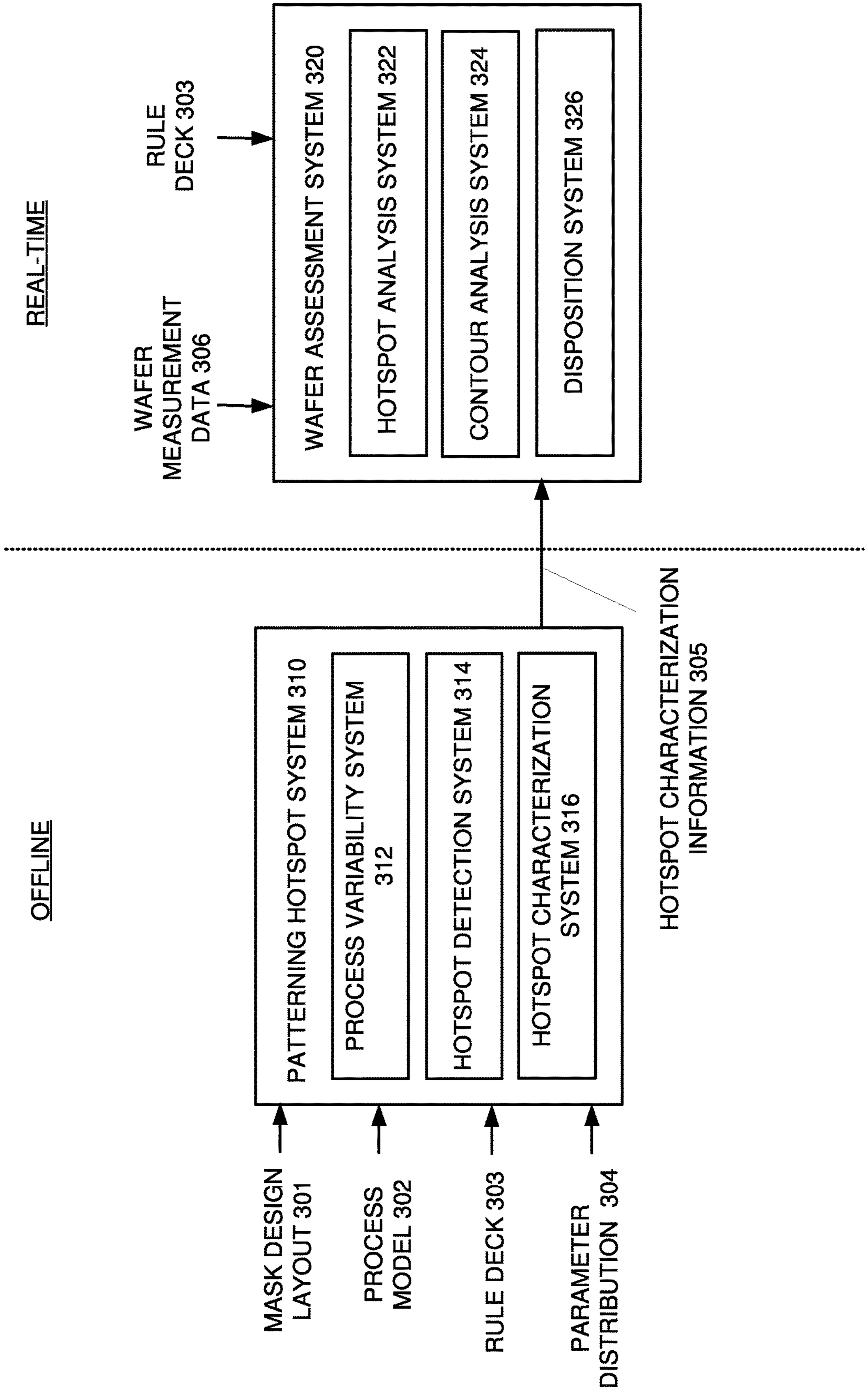
FIG. 3 illustrates an example dynamic wafer disposition system with real-time hotspot-based wafer analysis according to various embodiments.
Figure 7:
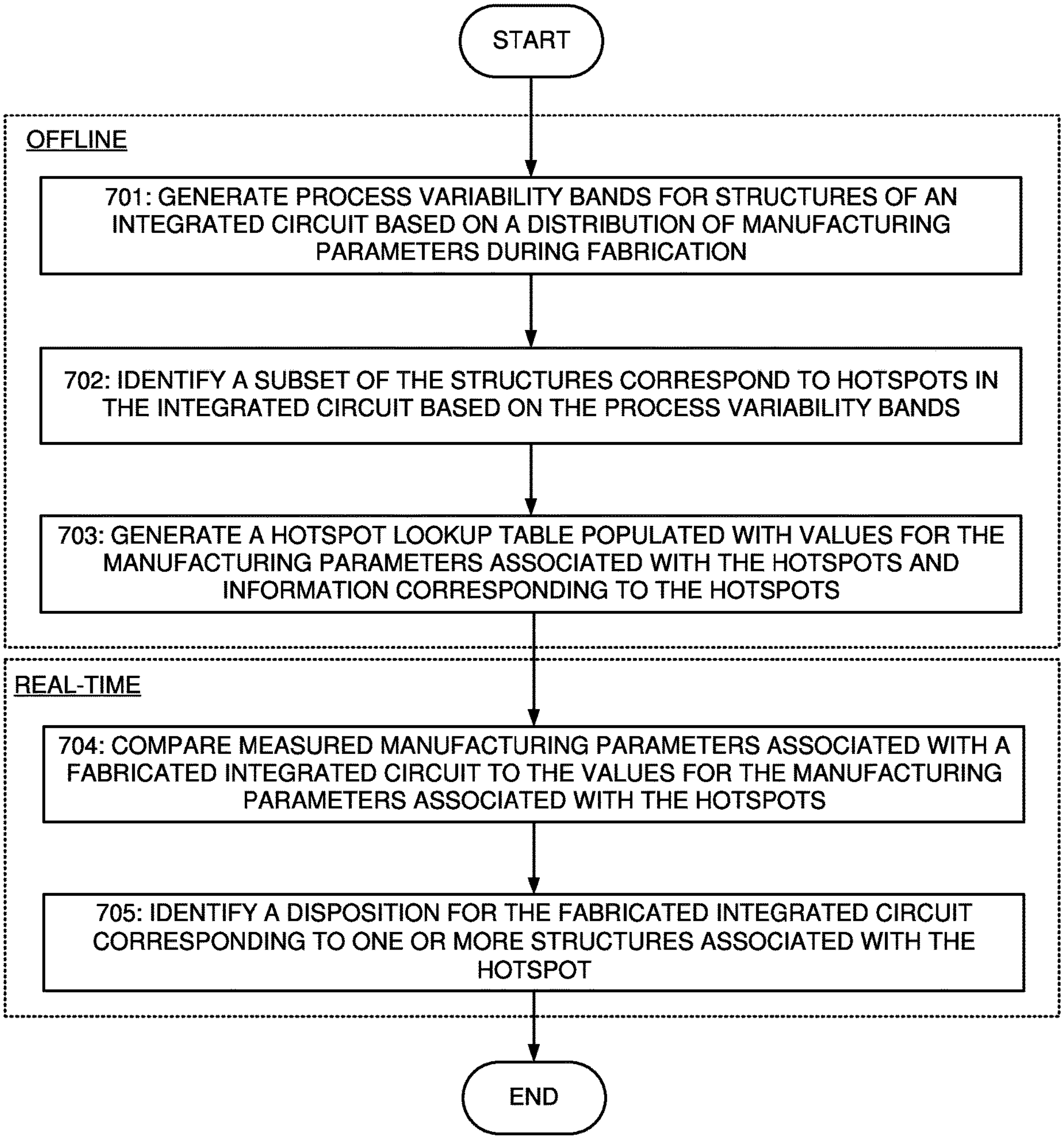
FIG. 7 illustrates an example dynamic wafer disposition with real-time hotspot-based wafer analysis according to various embodiments.

FIG. 3 illustrates an example dynamic wafer disposition system with real-time hotspot-based wafer analysis according to various embodiments. FIG. 7 illustrates an example dynamic wafer disposition with real-time hotspot-based wafer analysis according to various embodiments. Referring to FIGS. 3 and 7, a patterning hotspot system 310 can receive a mask design layout 301 describing a lithographic mask having a pattern that allows portions of a material layer to be exposed to light during a photolithographic process for a fabrication of an integrated circuit. The lithographic mask can be generated from the mask design layout 301, for example, with a reticle writing tool, which can enable fabrication of a target wafer image corresponding to a layout design of the integrated circuit. The layout design can define geometrical information capable of being utilized to manufacture the integrated circuit, which can be specified in a Graphic Data System II (GDSII) format, an Open Access format, a Milkyway format, an EDDM format, an Open Artwork System Interchange Standard (OASIS) format, or the like. In some embodiments, the mask design layout 301 could have undergone optical proximity correction, which can adjust the mask design layout 301 to alter an amplitude of light transmitted through a mask generated by the mask design layout 301 and increase overall pattern fidelity printed on the integrated circuit.

The patterning hotspot system 310 can receive a process model 302 that can describe the manufacturing process performed by a semiconductor manufacturer to fabricate the integrated circuit corresponding to the circuit design layout. The process model 302 can identify a critical dimension (CD) for the manufacturing process and types of operations performed to fabricate the integrated circuit. The process model 302 also can identify foundry values for manufacturing parameters, such as a focus of the light during a photolithographic process, an exposure dose or time period of the light exposure, or the like.

The patterning hotspot system 310 can receive a rule deck 303 describing lithographic analysis checks and design rules specifying dimensional constraints such as width, spacing, enclosure, or the like. The rule deck 303 can be in an American Standard Code for Information Interchange (ASCII) file format. The patterning hotspot system 310 can receive a parameter distribution 304 to identify which manufacturing parameters could vary during fabrication of the integrated circuit, such as a focus of the light during a photolithographic process, an exposure dose or time period of the light exposure, a critical dimension mask error, stochastic effects, or the like. The parameter distribution 304 also can identify a type of distribution of the manufacturing parameters during fabrication, and define how the manufacturing parameters may vary in that distribution. For example, when the manufacturing parameters vary according to a Gaussian distribution, the parameter distribution 304 can include a mean and standard deviation for each of the manufacturing parameters.

The patterning hotspot system 310 can include a process variability system 312 that, in a block 701 of FIG. 7, can generate process variability bands for different structures capable of being printed on an integrated circuit based on the mask design layout 301. The patterning hotspot system 310 can perform lithographic simulation of the mask layout design layout 301, for example, using the process model 302, to determine edge placement errors (EPE) for the contours of the structures capable of being printed on the integrated circuit over the various ranges of the exposure dose and focus depth manufacturing parameters described in the parameter distribution 304. In some embodiments, the EPE for the contours of the structures also can be based on structure overlay variation or alignment between layers. The process variability system 312 can aggregate the different edge placement errors to create the process variability bands for each structure. In some embodiments, the process variability bands can include a positive edge band, for example, having a maximum positive contour given different exposure doses, focus depths, and possibly alignments, and include a negative edge band, for example, having a maximum negative contour given different exposure doses, focus depths, and possibly alignments. Embodiments of the process variability bands will be described below with reference to FIGS. 4A and 4B.

Figure 4A:
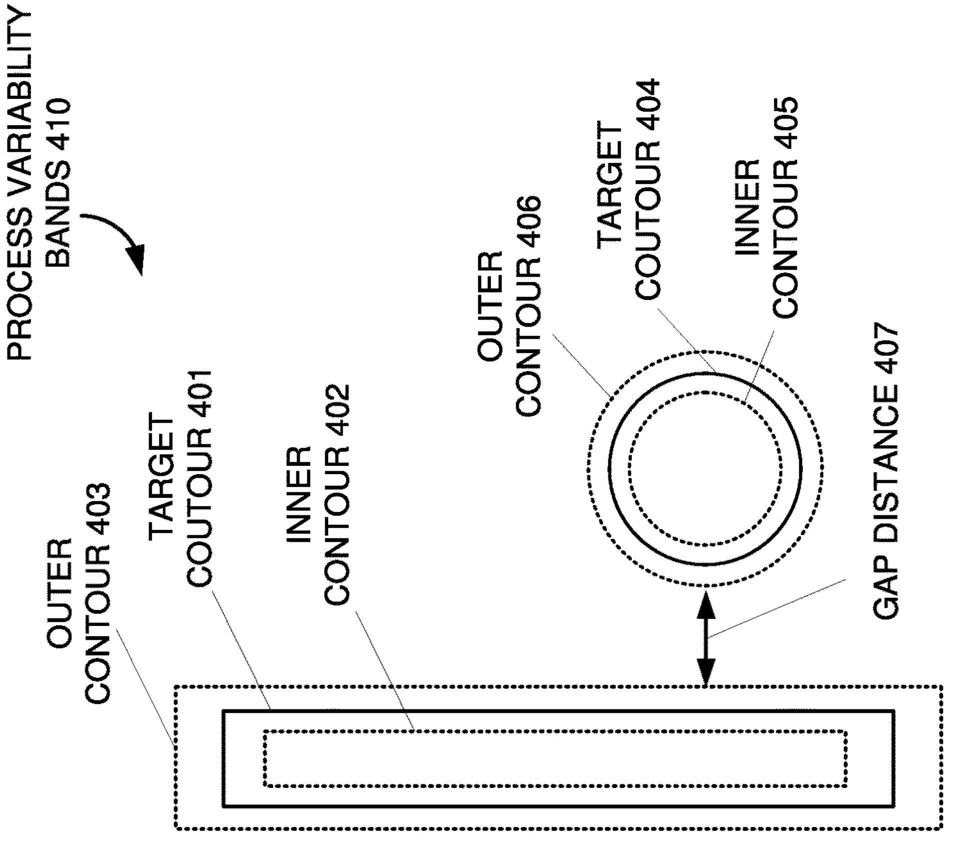
FIGS. 4A and 4B illustrates examples of process variability bands utilized by a patterning hotspot system according to various embodiments.
Figure 4B:
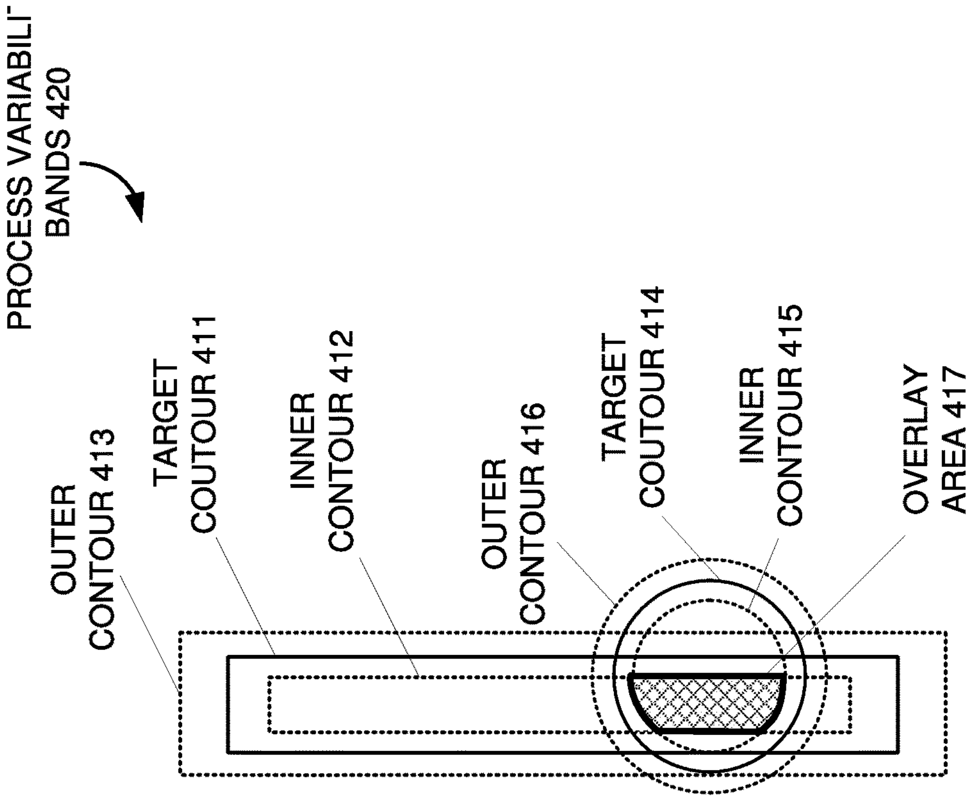

FIGS. 4A and 4B illustrates examples of process variability bands utilized by a patterning hotspot system according to various embodiments. Referring to FIG. 4A, process variability bands 410 can include sets of contours 401-403 and 404-406 for multiple structures capable of being printed on an integrated circuit during manufacture using a mask design layout. The process variability bands 410 can include target contours 401 and 404 corresponding to a target structure resulting from manufacture with the photolithographic process. As discussed above, manufacturing variability, such as variations of light exposure dose and focus depth, can lead to manufactured structures having a contour that deviates from the target contours 401 and 404.

The patterning hotspot system can simulate structures being manufactured with various combinations of manufacturing variability and utilize the results of the simulations to generate inner contours 402 and 405 and generate outer contours 403 and 406 of the process variability bands 410. In some embodiments, the patterning hotspot system can aggregate edge placement errors associated with the simulated structures to identify the inner contours 402 and 405, and identify the outer contours 403 and 406. The inner contours 402 and 405, in these examples, can have maximum negative contour given different exposure doses and focus depths, while the outer contours 403 and 406 can have a maximum positive contour given different exposure doses and focus depths.

The patterning hotspot system can utilize the process variability bands 410 to determine a gap distance 407 between the structures. The gap distance 407 can correspond to a minimum distance that the structures could be from each other given the different manufacturing variations of exposure dose and focus depth. In some embodiments, the patterning hotspot system can determine the gap distance 407 using the outer contours 403 and 406, for example, identifying where the outer contours 403 and 406 come closest to each other.

Referring to FIG. 4B, the process variability bands 420 with contours 411-416 are similar to the process variability bands 410 with contours 401-406 except the structures include an overlap, for example, on differing layers of the integrated circuit. The patterning hotspot system, instead of determining a gap distance between the structures utilizing the process variability bands 420, can determine an overlap area 417. The overlap area 417 can correspond to a minimum portion of the structures that overlap with each other given the different manufacturing variations that could occur. In some embodiments, the patterning hotspot system can determine the overlap area 417 using the inner contours 412 and 415.

Referring back to FIG. 3, the patterning hotspot system 310 can include a hotspot detection system 314 that, in a block 702 of FIG. 7, can utilize the process variability bands to detect hotspot structures associated with the mask design layout 301. In some embodiments, the hotspot detection system 314 can measure gap distances between the positive edge bands generated by the process variability system 312, and utilize the gap distances to identify one or more hotspot structures associated with mask design layout 301. For example, the hotspot detection system 314 can utilize the measured gap distances, the spacing and/or widths from the rule deck 303, and possibly different interlayer alignments to determine when a combination of exposure dose and focus depth during manufacturing could lead to a failure or a decision to rework the manufactured integrated circuit. In some embodiments, the hotspot detection system 314 can measure an overlay area using the negative edge bands generated by the process variability system 312, and utilize the overlay area to identify one or more hotspot structures associated with mask design layout 301. For example, the hotspot detection system 314 can utilize the overlay area, the spacing and/or widths from the rule deck 303, and possibly different interlayer alignments to determine when a combination of exposure dose and focus depth during manufacturing could lead to a failure or a decision to rework the manufactured integrated circuit.

In some embodiments, the hotspot detection system 314 also can classify the detected hotspots, on a per failure type basis, into hotspot masters. For example, the hotspot detection system 314 can identify groups of the detected hotspots having a common failure type and a similar exposure dose and focus depth, and classify the detected hotspots as corresponding to a hotspot master.

The patterning hotspot system 310 can include a hotspot characterization system 316 to utilize the detected hotspot structures associated with the mask design layout 301 to generate hotspot characterization information 305 for use in a real-time assessment of manufactured wafers. In some embodiments, the hotspot characterization system 316 can determine contours for the detected hotspots when manufactured with different combinations of the exposure dose and focus depth. When the hotspot detection system 314 has classified the detected hotspots into hotspot masters, the hotspot characterization system 316 can perform lithographic simulation, for example, with various exposure doses and focus depths, to generate an intensity grid for each of the hotspot masters, and utilize the intensity grids to generate the contours for each of the hotspot masters.

The hotspot characterization system 316 also can determine assessments for the detected hotspots when manufactured with different combinations of the exposure dose and focus depth. For example, the hotspot characterization system 316 can determine values of the exposure dose and the focus depth that, if present during manufacturing of the corresponding structure, would lead the structure to pass or fail the design rules in the rule deck 303. In some embodiments, the hotspot characterization system 316 also can determine ranges of values of the exposure dose and the focus depth that, if present during manufacturing of the corresponding structure, would indicate that additional contour analysis should be performed to determine whether the manufactured structure should be reworked.

In some embodiments, the hotspot characterization system 316 can set combinations of exposure dose and the focus depth through a non-uniform discretization of the values of the exposure dose and the focus depth. The non-uniform discretization of the values of the exposure dose and the focus depth can be performed by determining a lithographic response, for example, as a set of Bossung curves, which can then be utilized to sub-divide the range of exposure dose values and the range of focus depth values into different discrete bins. By categorizing the possible exposure doses and focus depths into discrete bins, the hotspot characterization system 316 can reduce the amount of the hotspot characterization information 305 generated for the real-time wafer assessment. Embodiments of the lithographic response will be described below with reference to FIG. 5.

Figure 5:
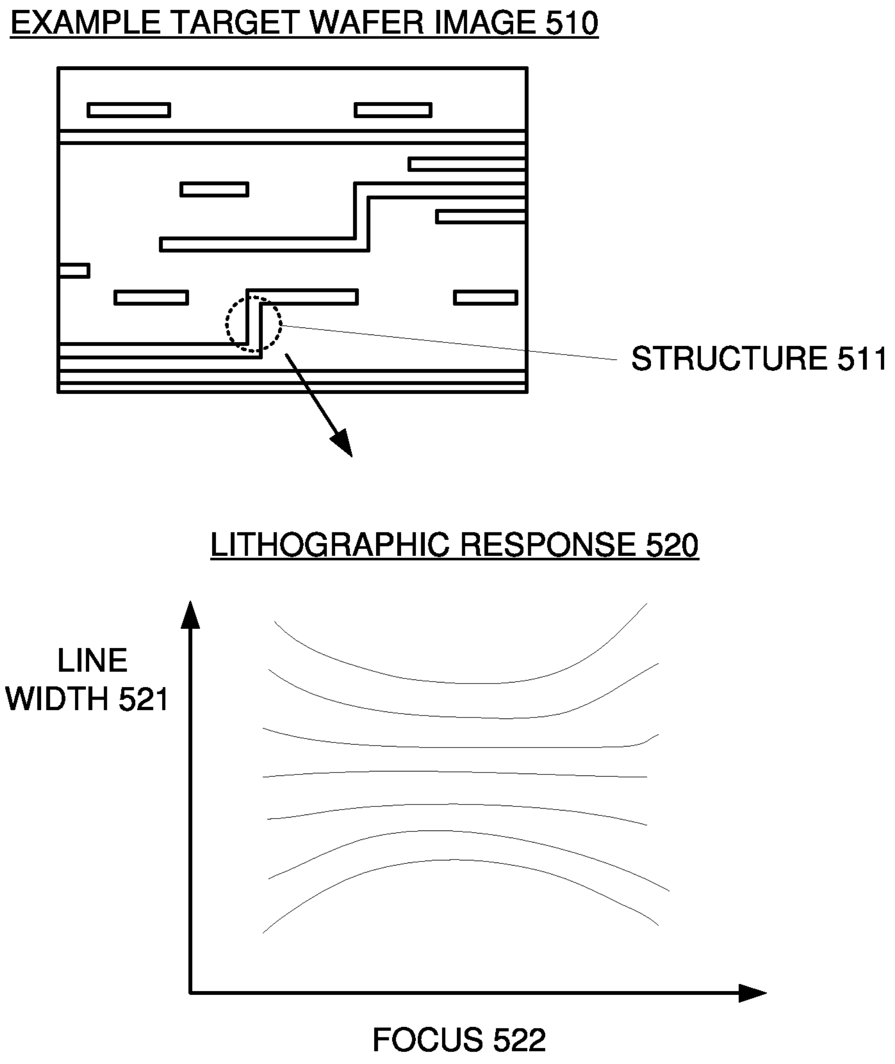
FIG. 5 illustrates an example target wafer image and a corresponding lithographic response for an integrated circuit structure in the target wafer image according to various embodiments.

FIG. 5 illustrates an example target wafer image 510 and a corresponding lithographic response 520 for an integrated circuit structure in the target wafer image 510 according to various embodiments. Referring to FIG. 5, the target wafer image 510 can correspond to structures to be fabricated during a photolithographic process from at least one lithographic mask, such as structure 511. The photolithographic process can include exposing light in patterns defined by the lithographic mask to layer materials disposed on a substrate to form the structures of the integrated circuit. Since manufacturing variability exists in this photolithography process, for example, variations in the focus of the light and/or the dose of the light exposure, the structures fabricated on the substrate can differ from the target wafer image 510.

In this example, the structure 511 can be characterized for different combinations of manufacturing parameters, such as dose and focus, to determine a lithographic response 520 to potential manufacturing variability. The lithographic response 520 can be represented as a set of curves in a graph, such as Bossung curves, having an x-axis corresponding to changes in focus 522 and the y-axis corresponding to resulting line width 521 changes for the structure 511. Each of the curves can correspond to a different dose provided during the characterization process. In some embodiments, the lithographic response 520 can be determined via simulation using design data for the lithographic mask to be used to fabricate the target wafer image 510.

Referring back to FIG. 3, the hotspot detection system 314 can utilize the Bossung curves to set a size of the bins for the dose and focus values. For example, when there is nominal defocus in the center of the x-axis of the Bossung curves, the hotspot detection system 314 can generate bins with an increased a range of values associated with the dose and focus, as the corresponding line width or critical dimension variations can be minimal over the range. However, when defocus increases, for example, at the left and right edges of the Bossung curves, the hotspot detection system 314 can generate bins with smaller ranges of values associated with the dose and focus, as the corresponding line width or critical dimension variations can increase over shorter ranges.

The hotspot characterization system 316, in a block 703 of FIG. 7, can generate a hotspot lookup table populated with values for the manufacturing parameters associated with the detected hotspots, and the hotspot characterization system 316 can include the hotspot lookup table in the hotspot characterization information 305. The hotspot lookup table can include values of exposure dose and focus depth along with corresponding hotspot information, such as contours for corresponding structures manufactured with those values of exposure dose and focus, assessments, e.g., pass, fail, or perform additional work, for structures manufactured with those values of exposure dose and focus. The hotspot lookup table can include overlay information, for example, deviation in an alignment on different layers of the manufactured integrated circuit. Embodiments of a lookup table with hotspot characterization information 305 for will be described below with reference to FIG. 6.

Figure 6:
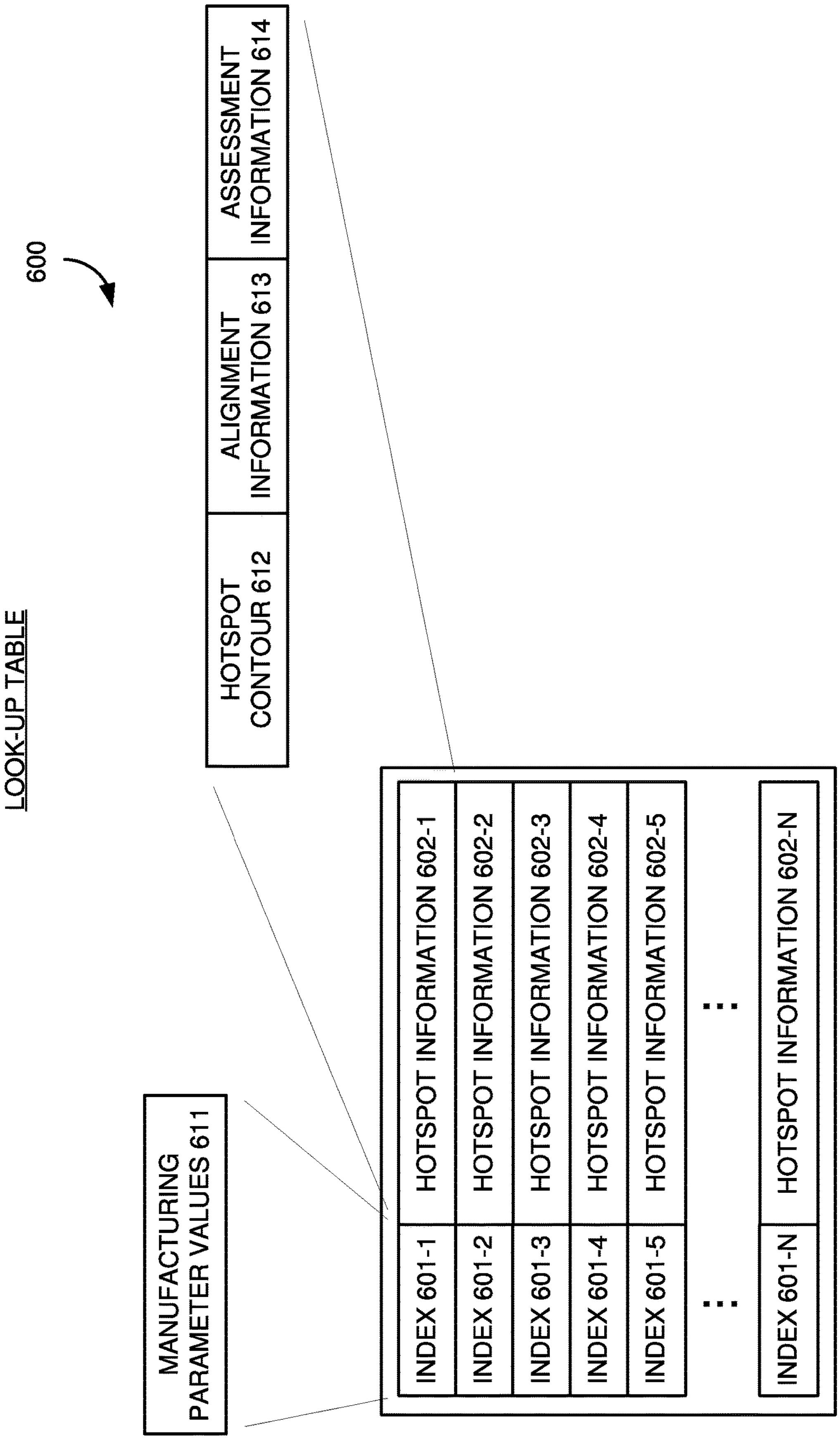
FIG. 6 illustrates an example lookup table with hotspot characterization information for use in real-time hotspot-based wafer analysis according to various embodiments.

FIG. 6 illustrates an example lookup table 600 with hotspot characterization information for use in real-time hotspot-based wafer analysis according to various embodiments. Referring to FIG. 6, the lookup table 600 can include entries having an index 601-1 to 601-N and corresponding hotspot information 602-1 to 602-N. The index can correspond to a set of manufacturing parameter values 611, such as exposure dose and focus depth. In some embodiments, the manufacturing parameter values 611 can correspond to ranges of values for the exposure dose and focus depth associated with the entries. The manufacturing parameter values 611 can be a discretized combination of exposure dose and focus depth associated with the entries.

The hotspot information 602-1 to 602-N for the entries can include a characterization for the detected hotspots when manufactured with the manufacturing parameter value 611 in the corresponding index 601-1 to 601-N. In some embodiments, the hotspot information 602-1 to 602-N can include a hotspot contour 612 for the detected hotspots when manufactured with the manufacturing parameter value 611 in the corresponding index 601-1 to 601-N. The hotspot contour 612 can correspond to a simulated version of the structure when manufactured with the manufacturing parameter value 611 in the corresponding index 601-1 to 601-N. The hotspot information 602-1 to 602-N also can include alignment information 613 for the detected hotspots when manufactured with the manufacturing parameter value 611 in the corresponding index 601-1 to 601-N. In some embodiments, the alignment information can correspond to simulated interlayer shifts in contours associated with the structure(s) in the detected hotspots. The hotspot information 602-1 to 602-N also can include assessment information 614 for the detected hotspots when manufactured with the manufacturing parameter value 611 in the corresponding index 601-1 to 601-N. The assessment information 614 can correspond to indications a pass, a fail, or a further analysis to perform when the detected hotspots have been manufactured with the manufacturing parameter value 611 in the corresponding index 601-1 to 601-N.

The entries in the lookup table 600, in some embodiments, can be accessed utilizing the index 601-1 to 601-N. For example, when an integrated circuit has been manufactured and metrology data indicated a certain combination of exposure dose and focus depth has been utilized during manufacture, an entry of the lookup table 600 can be accessed to identify the corresponding hotspot information 602-1 to 602-N based on that metrology data. By detecting hotspots up-front and entering their characterization into a lookup table 600, the real-time wafer assessment can utilize the actual measured dose and focus values to quickly determine whether the manufactured integrated circuit includes a defect or failure.

Referring back to FIG. 3, a wafer assessment system 320 can receive the rule deck 303, the hotspot characterization information 305, and wafer measurement data 306 corresponding to metrology data of exposure dose, focus depth, alignment, or the like, at various sites of manufactured wafers. The wafer assessment system 320 can perform a real-time disposition assessment for manufactured wafers, for example, by determining whether to initiate rework of one or more of the manufacturing steps.

The wafer assessment system 320 can include a hotspot analysis system 322 that, in a block 704 of FIG. 7, can compare the wafer measurement data 306 associated with a fabricated integrated circuit to the values for the manufacturing parameters associated with the detected hotspots. In some embodiments, the hotspot analysis system 322 can utilize the measurement data 306 to identify one or more entries in a hotspot lookup table received in the hotspot characterization information 305, and then utilize the hotspot information in those looked-up entries to assess and dispose of the wafer. For example, when the hotspot analysis system 322 accesses an entry in the hotspot lookup table that indicates the wafer has passed or failed, the hotspot analysis system 322 can dispose of the wafer based on the assessment in the hotspot lookup table.

In some embodiments, the hotspot analysis system 322 can access an entry in the hotspot lookup table that provides a contour of the structure associated with the hotspot manufactured with the wafer measurement data 306. The wafer assessment system 320 can include a contour analysis system 324 to perform a fine contour generation for the hotspot structure based on the dose and focus in the measurement data 306, shift the generated contour of the structure based on the alignment data in the measurement data 306, and assess the aligned contour for a failure or rework. When the hotspot corresponds to a multiple layer overlap, the contour analysis system 324 to perform a fine contour generation for multiple structures on different layers based on the dose and focus in the measurement data 306, which can also include shifts in the generated contours of the structures based on the alignment data in the measurement data 306 before assessing the aligned contours for a failure or rework.

The wafer assessment system 320 can include a wafer disposition system 326 that, in a block 705 of FIG. 7, can identify a disposition for the fabricated integrated circuit corresponding to one or more structures associated with the identified hotspot. The wafer disposition system 326 can generate an analysis and rework decision (ARD), which can be based on the hotspot information retrieved from the lookup table or based on the contour analysis. In some embodiments, the wafer disposition system 326 also can generate visualizations of wafers or dies corresponding to the disposition of the detected hotspots. For example, the wafer disposition system 326 can generate a failure map that can provide a visualization of the position of failures on a wafer scale, on a field scale or on a die scale. The failure map also can illustrate dies that have a number of failures exceed a specification or include a substantial defect. The failure map can be annotated with information corresponding to a type of the failure type, such as a bridge or an area with insufficient overlap area, along with a type of pattern associated with the failure. In some embodiments, the wafer disposition system 326 also can generate a plot, such as Pareto plot, which illustrates a frequency of failures depending on failure types, a trend of increase or decrease of number of failure relative to dose, focus, and/or overlay variations, or the like. The wafer disposition system 326 can generate a visualization of the underlying layout data associated with a structure or group of structures along with the contours generated by the system during lithographic simulation.

The wafer disposition system 326 can determine an expectation of rework based on the disposition of the hotspots. In some embodiments, the wafer disposition system 326 can identify a number of failure points on dies that can be improved if performing rework on a wafer. The wafer disposition system 326 can determine a rework reduction rate (RRR), which can correspond to an elimination of rework based on a conventional overlay specification. For example, since many conventional rework analyses were overly pessimistic, leading to unneeded rework, the wafer disposition system 326 can identify how much rework was saved by the wafer assessment system 320.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:

simulating, by a computing system implementing off-line hotspot identification, structures of an integrated circuit capable of being fabricated utilizing at least one lithographic mask based, at least in part, on a mask layout data describing the lithographic mask and a distribution of manufacturing parameters during fabrication, wherein simulating the structures includes identifying different printed contours for the structures of the integrated circuit capable of being fabricated when using different manufacturing parameters within the distribution of the manufacturing parameters;

determining, by computing system implementing the off-line hotspot identification, edge placement errors for the different printed contours of the structures identified during the simulation;

generating, by computing system implementing the off-line hotspot identification, process variability bands for the structures of the integrated circuit from the edge placement errors and the different printed contours for the structures of the integrated circuit;

utilizing, by the computing system implementing the off-line hotspot identification, the process variability bands to identify a subset of the structures that correspond to hotspots in the integrated circuit and identify corresponding values for the manufacturing parameters associated with the identified hotspots;

generating, by the computing system implementing the off-line hotspot identification, a lookup table storing information corresponding to the identified hotspots in the integrated circuit and the values for the manufacturing parameters associated with the identified hotspots, wherein the information corresponding to the identified hotspots in the integrated circuit includes one or more of simulated contours of the structures manufactured with the manufacturing parameters, simulated interlayer shifts in the simulated contours associated with the structures in the identified hotspots, or an assessment of a comparison of design rules to the identified hotspot manufactured with the manufacturing parameters;

comparing, by a wafer testing system implementing real-time wafer assessment, measured manufacturing parameters associated with a fabricated integrated circuit to the values for the manufacturing parameters associated with the identified hotspots, comprising indexing the lookup table with the measured manufacturing parameters associated with the fabricated integrated circuit to identify the information corresponding to the identified hotspots in the integrated circuit; and dynamically identifying, by the wafer testing system implementing real-time wafer assessment, a disposition for the fabricated integrated circuit based on the comparison corresponding to one or more structures associated with the identified hotspot.

2. The method of claim 1, wherein the process variability bands for the structures include outer contours, and wherein utilizing the process variability bands to identify the subset of the structures correspond to hotspots in the integrated circuit further comprises:

measuring gap distances between the outer contours of the process variability bands for the structures; and identifying hotspots in the integrated circuit based on magnitudes of the gap distances between the outer contours.

3. The method of claim 1, wherein the process variability bands for the structures include inner contours, and wherein utilizing the process variability bands to identify the subset of the structures correspond to hotspots in the integrated circuit further comprises:

measuring overlap areas of the structures based the inner contours of the process variability bands for the structures; and identifying hotspots in the integrated circuit based on sizes of the overlap areas.

4. The method of claim 1, further comprising performing, by the computing system, an overlay simulation to identify a relative alignment between a plurality of the structures corresponding to different layers of the integrated circuit, wherein the identification of the subset of the structures corresponding to hotspots is based on the process variability bands and the relative alignment between the plurality of the structures corresponding to different layers of the integrated circuit.

5. The method of claim 1, wherein the manufacturing parameters correspond to at least one of a focus of light exposed through the lithographic mask onto the integrated circuit, an exposure dose for the light, and a relative alignment of the between the structures corresponding to different layers of the integrated circuit.

6. A system comprising:

a hotspot identification system configured to:

simulate structures of an integrated circuit capable of being fabricated utilizing at least one lithographic mask based, at least in part, on a mask layout data describing the lithographic mask and a distribution of manufacturing parameters during fabrication, wherein simulating the structures includes identifying different printed contours for the structures of the integrated circuit capable of being fabricated when using different manufacturing parameters within the distribution of the manufacturing parameters;

determine edge placement errors for the different printed contours of the structures identified during the simulation;

generate process variability bands from the edge placement errors and the different printed contours for the structures of the integrated circuit;

utilize the process variability bands to identify a subset of the structures that correspond to hotspots in the integrated circuit and identify corresponding values for the manufacturing parameters associated with the identified hotspots generate a lookup table storing information corresponding to the identified hotspots in the integrated circuit and the values for the manufacturing parameters associated with the identified hotspots, wherein the information corresponding to the identified hotspots in the integrated circuit includes one or more of simulated contours of the structures manufactured with the manufacturing parameters, simulated interlayer shifts in the simulated contours associated with the structures in the identified hotspots, or an assessment of a comparison of design rules to the identified hotspot manufactured with the manufacturing parameters; and a wafer testing system configured to implement real-time wafer assessment by comparing measured manufacturing parameters associated with a fabricated integrated circuit to the values for the manufacturing parameters associated with the identified hotspots, and dynamically identifying a disposition for the fabricated integrated circuit based on the comparison corresponding to one or more structures associated with the identified hotspot, wherein the comparing comprises indexing the lookup table with the measured manufacturing parameters associated with the fabricated integrated circuit to identify the information corresponding to the identified hotspots in the integrated circuit.

7. The system of claim 6, wherein the process variability bands for the structures include outer contours, and wherein the hotspot identification system is configured to utilize the process variability bands to identify the subset of the structures correspond to hotspots in the integrated circuit by measuring gap distances between the outer contours of the process variability bands for the structures, and identifying hotspots in the integrated circuit based on magnitudes of the gap distances between the outer contours.

8. The system of claim 6, wherein the process variability bands for the structures include inner contours, and wherein the hotspot identification system is configured to utilize the process variability bands to identify the subset of the structures correspond to hotspots in the integrated circuit by measuring overlap areas of the structures based the inner contours of the process variability bands for the structures, and identifying hotspots in the integrated circuit based on sizes of the overlap areas.

9. The system of claim 6, wherein the hotspot identification system is configured to perform an overlay simulation to identify a relative alignment between a plurality of the structures corresponding to different layers of the integrated circuit, and to identify the subset of the structures corresponding to hotspots based on the process variability bands and the relative alignment between the plurality of the structures corresponding to different layers of the integrated circuit.

10. The system of claim 6, wherein the manufacturing parameters correspond to at least one of a focus of light exposed through the lithographic mask onto the integrated circuit, an exposure dose for the light, and a relative alignment of the between the structures corresponding to different layers of the integrated circuit.

11. An apparatus including a memory device storing instructions configured to cause one or more processing devices to perform operations comprising:

simulating structures of an integrated circuit capable of being fabricated utilizing at least one lithographic mask based, at least in part, on a mask layout data describing the lithographic mask and a distribution of manufacturing parameters during fabrication, wherein simulating the structures includes identifying different printed contours for the structures of the integrated circuit capable of being fabricated when using different manufacturing parameters within the distribution of the manufacturing parameters;

determining edge placement errors for the different printed contours of the structures identified during the simulation;

generating process variability bands for the structures of the integrated circuit from the edge placement errors and the different printed contours for the structures of the integrated circuit; and utilizing the process variability bands to identify a subset of the structures that correspond to hotspots in the integrated circuit and identify corresponding values for the manufacturing parameters associated with the identified hotspots; and generating a lookup table storing information corresponding to the identified hotspots in the integrated circuit and the values for the manufacturing parameters associated with the identified hotspots, wherein the lookup table, when indexed with measured manufacturing parameters associated with the fabricated integrated circuit, is configured to identify the information corresponding to the identified hotspots in the integrated circuit, wherein the information corresponding to the identified hotspots in the integrated circuit includes one or more of simulated contours of the structures manufactured with the manufacturing parameters, simulated interlayer shifts in the simulated contours associated with the structures in the identified hotspots, or an assessment of a comparison of design rules to the identified hotspot manufactured with the manufacturing parameters, wherein the values for the manufacturing parameters associated with the identified hotspots are configured to allow dynamic identification a disposition for the fabricated integrated circuit based on the comparison corresponding to one or more structures associated with the identified hotspot, and wherein the comparison is performed by indexing the lookup table with the measured manufacturing parameters associated with the fabricated integrated circuit to identify the information corresponding to the identified hotspots in the integrated circuit.

12. The apparatus of claim 11, wherein the process variability bands for the structures include outer contours, and wherein the instructions are configured to cause one or more processing devices to perform operations further comprising utilizing the process variability bands to identify the subset of the structures correspond to hotspots in the integrated circuit by measuring gap distances between the outer contours of the process variability bands for the structures, and identifying hotspots in the integrated circuit based on magnitudes of the gap distances between the outer contours.

13. The apparatus of claim 11, wherein the process variability bands for the structures include outer contours, and wherein the instructions are configured to cause one or more processing devices to perform operations further comprising utilizing the process variability bands to identify the subset of the structures correspond to hotspots in the integrated circuit by measuring overlap areas of the structures based the inner contours of the process variability bands for the structures, and identifying hotspots in the integrated circuit based on sizes of the overlap areas.

14. The apparatus of claim 11, wherein the manufacturing parameters correspond to at least one of a focus of light exposed through the lithographic mask onto the integrated circuit, an exposure dose for the light, and a relative alignment of the between the structures corresponding to different layers of the integrated circuit.

* * * * *